United States Patent
Mao et al.

(10) Patent No.: US 11,108,372 B2
(45) Date of Patent: Aug. 31, 2021

(54) COMPACT BALANCED RADIO FREQUENCY BALUN FACILITATING EASY INTEGRATION

(71) Applicant: Integrated Device Technology, Inc., San Jose, CA (US)

(72) Inventors: Chuying Mao, Westford, MA (US); Ran Li, Winchester, MA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 16/672,816

(22) Filed: Nov. 4, 2019

(65) Prior Publication Data

US 2021/0135647 A1    May 6, 2021

(51) Int. Cl.
*H04B 1/44* (2006.01)
*H03H 7/42* (2006.01)

(52) U.S. Cl.
CPC ............. *H03H 7/422* (2013.01); *H04B 1/44* (2013.01)

(58) Field of Classification Search
CPC . H03F 7/04; H03F 1/565; H03F 3/195; H03F 3/245; H03F 2200/06; H03F 2200/09; H04B 5/0031; H04B 5/0075; H04B 5/0081; H04B 1/18
See application file for complete search history.

(56) References Cited

U.S. PATENT DOCUMENTS

| | | | | |
|---|---|---|---|---|
| 7,629,860 B2 | 12/2009 | Liu et al. | | 333/25 |
| 2008/0139131 A1 | 6/2008 | MacPhail | | 455/90.2 |
| 2008/0174396 A1* | 7/2008 | Choi | | H01F 27/2804 336/182 |
| 2010/0109798 A1* | 5/2010 | Chu | | H03H 7/38 333/124 |
| 2019/0326872 A1* | 10/2019 | Cheng | | H03H 7/425 |

OTHER PUBLICATIONS

Wu, Sung-Mao et al., "The High Balance Symmetric Balun for WLAN and WiMAX Application Using the Integrated Passive Device (IPD) Technology", 2009 International Conference on Electronic Packaging Technology & High Density Packaging (ICEPT_HDP), 2009 IEEE, pp. 14-17.

Ko, Jaeyong et al., "An S/X Band CMOS Power Amplifier Using a Transformer-Based Reconfigurable Output Matching Network", 2017 IEEE Radio Frequency Integrated Circuits Symposium, 2017 IEEE, pp. 344-347.

* cited by examiner

*Primary Examiner* — Nhan T Le
(74) *Attorney, Agent, or Firm* — Christopher P. Maiorana, PC

(57) ABSTRACT

An apparatus comprises a first circuit and a second circuit. The first circuit generally comprises differential symmetric band extension circuitry. The second circuit generally comprises coupled inductor coils configured to convert between differential and single-ended signal formats.

20 Claims, 13 Drawing Sheets

COMPACT BALANCED RADIO FREQUENCY BALUN FACILITATING EASY INTEGRATION

FIELD OF THE INVENTION

The invention relates to impedance matching in radio frequency (RF) circuits generally and, more particularly, to a method and/or apparatus for implementing a compact balanced radio frequency (RF) balun facilitating easy integration.

BACKGROUND

In radio frequency (RF) wireless communication systems, differential signals with good amplitude and phase balance are immune to common-mode noise and even-order distortion. For good suppression of common-mode noise and even-order distortion, or for connection of a balanced signal to an unbalanced signal, on-chip signals need to be converted from single-ended form to differential form or vice versa. A balun is a device that is typically used to convert single-ended (or unbalanced) signals to differential (or balanced) signals and vice versa. Conventionally, transmission line based baluns (transformers) are implemented to achieve ultra wide bandwidth, especially at UHF (ultra high frequency, i.e., 300-3000 MHz). However, transmission line based baluns are inherently very bulky at the operating frequency and not feasible for on chip design. In addition to a fixed input/output impedance balun design, a switchable input impedance balun design is also needed in RF integrated systems for flexibility in high efficiency broadband applications. Previous attempts at providing switchable input impedance utilized switchable transformer cores, which occupy a large on-chip area.

It would be desirable to implement a compact balanced radio frequency (RF) balun facilitating easy integration.

SUMMARY

The invention concerns an apparatus comprising a first circuit and a second circuit. The first circuit generally comprises differential symmetric band extension circuitry. The second circuit generally comprises coupled inductor coils configured to convert between differential and single-ended signal formats.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a compact balanced radio frequency (RF) balun that may (i) facilitate easy integration, (ii) provide wideband operation, (iii) provide switchable impedance, (iv) extend low frequency response, (v) convert between differential and single-ended formats, (vi) occupy significantly smaller area than conventional baluns, (vii) be particularly suited for, but not limited to, silicon, CMOS, FET, and/or HEMT technologies, and/or (viii) be implemented in integrated circuits.

Conventional coupled inductor coils with input/output tuning capacitors may be used for on-chip high frequency balun (transformer) design with compact size. A differential high pass filter composed by a differential shunt inductor and alternating current (AC) coupling capacitors at the balanced side of a balun (transformer) may extend low frequency response. The use of a differential shunt inductor with a grounded center tap generally helps to boost common-mode rejection at low frequency while minimizing the chip area occupied. Combining the above features may achieve compact wide band balanced balun design for RF wireless communication systems. A switch controlled differential inductor at the differential port with switchable input/output tuning capacitors may convert either 100 Ohm or 50 Ohm differential port impedance to a fixed 50 Ohm single-ended impedance. The inherent switchable symmetric topology generally gives good phase and amplitude balance for both impedance transformations.

Figure 1:
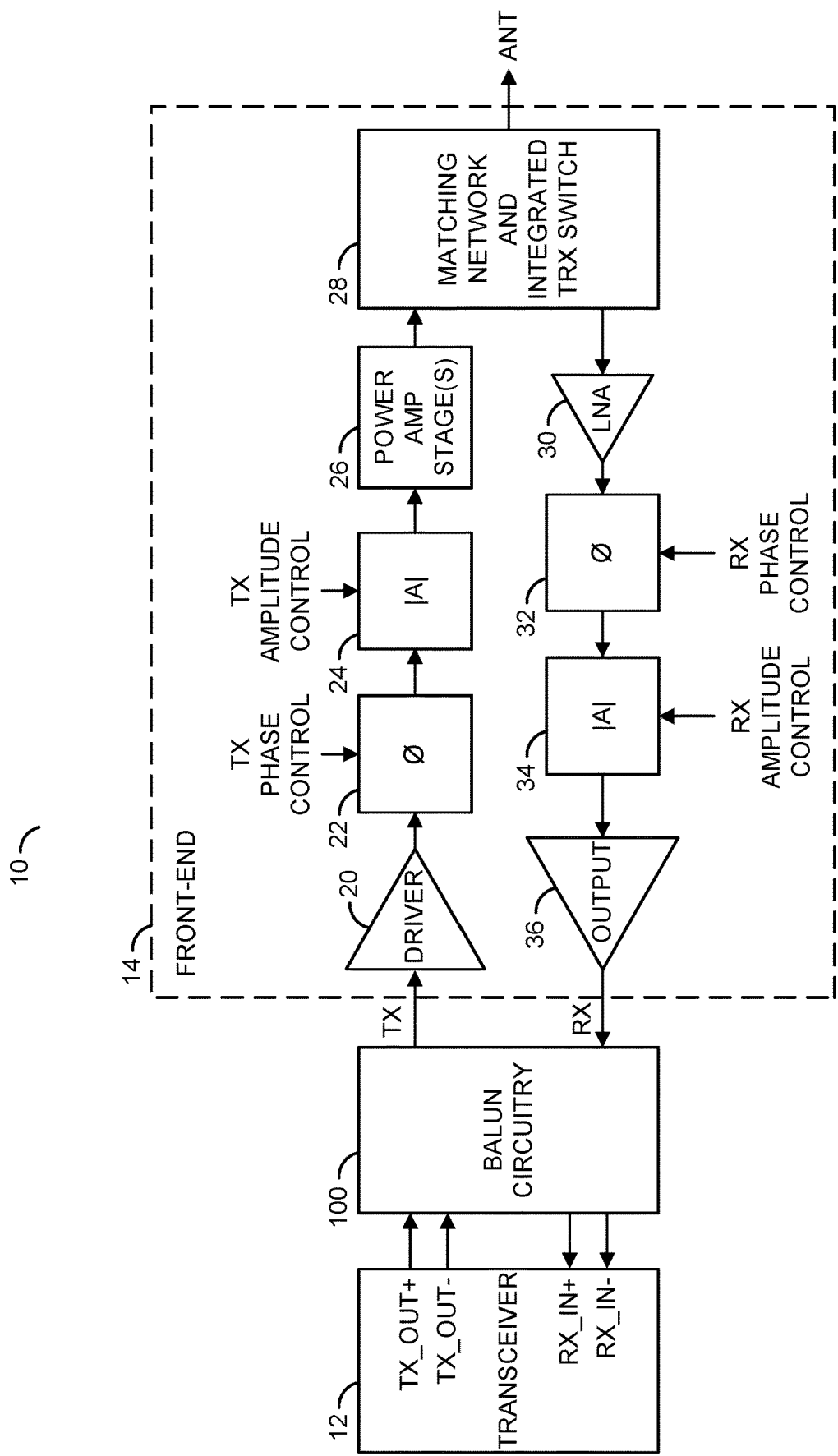
FIG. 1 is a diagram illustrating an example context of the invention.

Referring to FIG. 1, a block diagram of a circuit 10 is shown illustrating an example context in which balun circuits in accordance with an example embodiment of the invention may be implemented. In an example embodiment, the circuit 10 may implement transceiver and front-end circuits of a radio frequency (RF) wireless communication system. A transceiver is generally capable of both transmitting and receiving signals of a communication channel. In various embodiments, the circuit 10 may be capable of transmitting and receiving radio frequency (RF), microwave, and/or millimeter-wave signals. In various embodiments, the circuit 10 may be representative of transceiver and front-end circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and/or portable handheld devices (UEs). In some embodiments, the circuit 10 may be representative of a radar application including, but not limited to target detection, ranging, and/or through-wall imaging. In an example, the circuit 10 may be implemented as an integrated circuit (IC) device. In an example, the circuit 10 may be implemented as part of a monolithic microwave integrated circuit (MMIC).

In an example, the circuit 10 generally comprises a transceiver circuit 12 and a front-end circuit 14. The transceiver circuit 12 may have a differential output port and a differential input port. The differential output port may present a differential pair of signals TX_OUT+ and TX_OUT−. The differential input port may receive a differential pair of signals RX_IN+ and RX_IN−. In an example, the front-end circuit 14 may have a single-ended output port, a single-ended input port, and common input/output port. A single-ended format signal TX may be presented to the input port of the front-end circuit 14. The output port of the front-end circuit may present a single-end signal RX. The common input/output port of the front-end circuit 14 may be configured to connect the front-end circuit to an antenna or a transmission line.

In various embodiments, the transceiver circuit 12 may be connected to the front-end circuit 14 by a circuit 100. In various embodiments, the circuit 100 generally comprises one or more balun (transformer) circuits in accordance with an embodiment of the invention. In an example, the circuit 100 may be configured to convert (i) the differential pair of signals TX_OUT+ and TX_OUT− to the single-ended format signal TX for presentation to the single-ended input port of the front-end circuit 14 and (ii) the single-ended formal signal RX from the output port of the front-end circuit 14 to the differential pair of signals RX_IN+ and RX_IN− for presentation to the differential input port of the transceiver circuit 12.

In an example, the front-end circuit 14 may comprise both a transmitter chain and a receiver chain. Both the transmitter chain and the receiver chain may comprise radio frequency (RF) amplifiers. In an example, the transmitter chain may include an input amplifier 20, a variable phase shifter 22, a variable attenuator 24, and one or more output amplifier stages 26. In an example, the input amplifier 20 may be implemented as a pre-driver amplifier. The output amplifier stages 26 may include drivers, pre-amplifiers, and/or power amplifiers. In an example, the single-ended input port of the front-end circuit 14 may be connected to an input of the input amplifier 20. In an example, the output of the transmitter chain may be either a single-ended format or a differential format signal. The variable phase shifter 22 may be controlled in response to a control signal TX PHASE CONTROL. The variable attenuator 24 may be controlled in response to a control signal TX AMPLITUDE CONTROL.

In an example, the receiver chain may include an input amplifier 30, a variable phase shifter 32, a variable attenuator 34, and an output amplifier 36. In an example, the input amplifier 30 may be implemented as a low noise amplifier (LNA). In an example, the input of the receiver chain may be either a single-ended format or a differential format signal. In an example, the output of the transmitter chain and the input of the receiver chain may be coupled to a transmission line or an antenna by a matching network and integrated transmit-receive (TRX) switch circuit 28. In various embodiments, the circuit 28 may comprise output and input impedance matching networks along with a high isolation switch. In an example, an output of the output amplifier 36 may be connected to the single-ended output port of the front-end circuit 14. The variable phase shifter 32 may be controlled in response to a control signal RX PHASE CONTROL. The variable attenuator 34 may be controlled in response to a control signal RX AMPLITUDE CONTROL.

Figure 2:
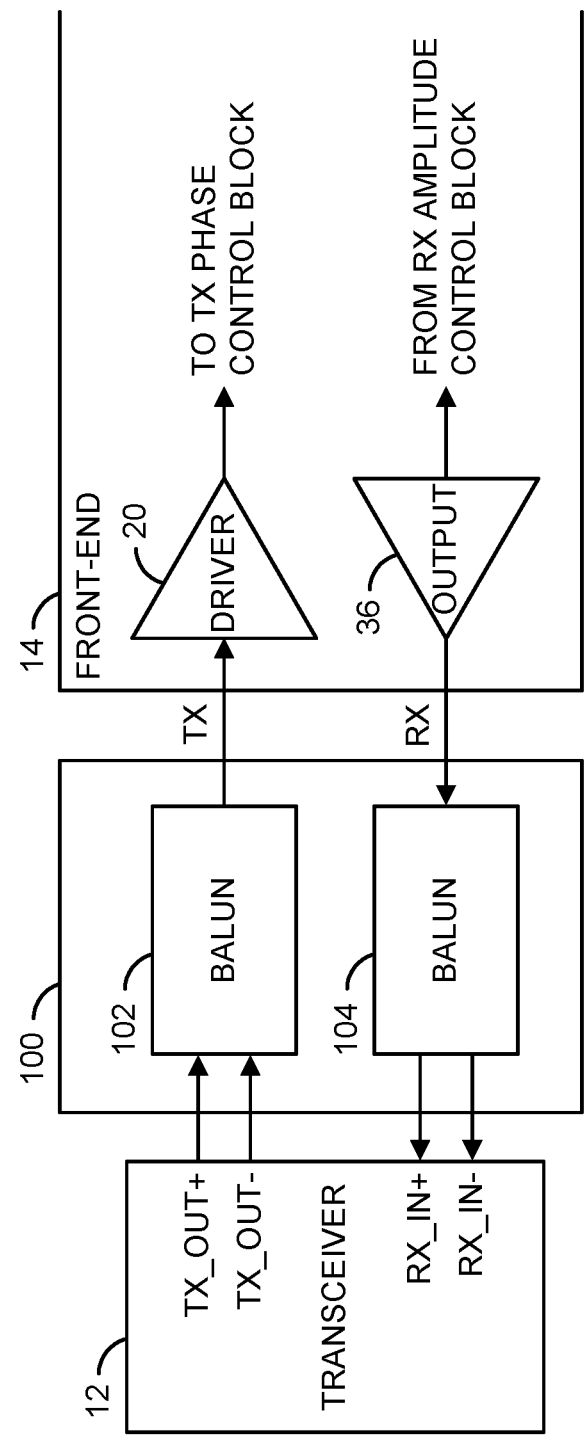
FIG. 2 is a diagram illustrating balun circuits in accordance with an example embodiment of the invention.

Referring to FIG. 2, a diagram is shown illustrating an example implementation of the circuit 100 in accordance with an example embodiment of the invention. In an example, the circuit 100 may comprise a block (or circuit) 102 and a block (or circuit) 104. The circuit 102 may be implemented as a balun circuit in accordance with an embodiment of the invention. The circuit 104 may be implemented as a balun circuit in accordance with an embodiment of the invention. In an example, a differential input port of the circuit 100 may present the differential pair of signals TX_OUT+ and TX_OUT− to a differential input of the balun circuit 102. A single-ended output of the balun circuit 102 may present the single-ended signal TX to a single-ended output of the circuit 100. In an example, a single-ended input port of the circuit 100 may present the single-end signal RX to a single-ended input of the balun circuit 104. A differential output of the balun circuit 104 may present the differential pair of signals RX_IN+ and RX_IN− to a differential output of the circuit 100.

In an example, the balun circuit 102 may be configured to convert the differential pair of output signals TX_OUT+ and TX_OUT− from the transceiver circuit 12 to the single-ended signal TX. In another example, the balun circuit 102 may be configured to convert between (match) an impedance of the differential output signal path from the transceiver circuit 12 to an impedance of the single-ended signal path to the transmitter chain of the front-end circuit 14. In an example, the balun circuit 104 may be configured to convert the single-ended signal RX from the output amplifier circuit 36 to the differential pair of input signals RX_IN+ and RX_IN− presented to the input transceiver circuit 12. In another example, the balun circuit 104 may be configured to convert between (match) the impedance of the single-ended signal path from the output amplifier 36 to the impedance of the differential input signal path of the transceiver circuit 12. In various embodiments, the balun circuit 102 (or 104) may be configured to implement a switchable impedance that converts either a 100 Ohm or a 50 Ohm differential port impedance to a fixed 50 Ohm single-ended impedance.

Figure 3:
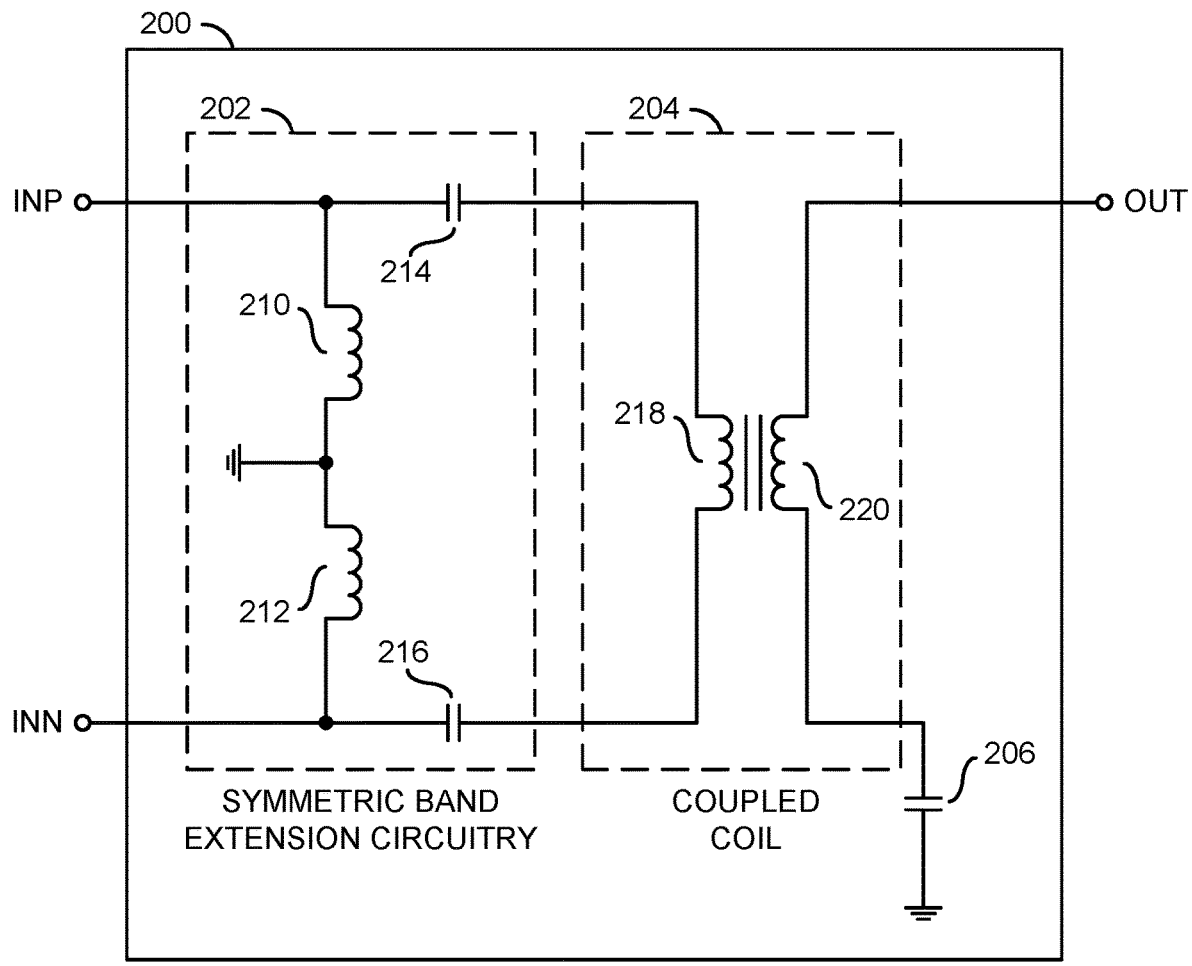
FIG. 3 is a diagram illustrating an example implementation of a balun circuit in accordance with an example embodiment of the invention.

Referring to FIG. 3, a diagram of a circuit 200 is shown illustrating an example implementation of a balun circuit in accordance with an example embodiment of the invention. In various embodiments, the circuit 200 may be used to implement the balun circuits 102 and/or 104 of FIG. 2. In an example, the circuit 200 may comprise a block (or circuit) 202, a block (or circuit) 204, and a capacitor 206. In various embodiments, the circuit 202 may implement symmetric band extension circuitry. In an example, the circuit 204 may be implemented using integrated coupled inductor coils. In an example, the integrated coil structures of the circuit 204 may form spiral inductor devices that are magnetically coupled with one another. In addition to the inductive property of a single coil structure, multiple integrated coil structures may have an associated mutual inductance that may help to achieve a more compact footprint.

In an example, the circuit 200 may have a differential input/output port and a single-ended output/input port. In an example, a differential signal (e.g., INP, INN) may be presented to the differential input/output port and a single-ended output signal (e.g., OUT) may be presented at the single-ended output/input port. Operation of the balun circuit 200 may be reversed. For example, a single-ended input signal may be presented to the single-ended output/input port of the circuit 200 and a differential output signal may be presented at the differential input/output port of the circuit 200.

The circuit 202 may have a differential input/output that may be connected to the differential input/output port of the circuit 200. The circuit 202 may have a differential output/input that may be connected to a differential input/output port of the circuit 204. The circuit 204 may have a differential output/input. A first terminal of the differential output/input of the circuit 204 may be connected to the single-ended output/input port of the circuit 200. A second terminal of the differential output/input of the circuit 204 may be connected via the capacitor 206 to a circuit ground potential.

In an example, the circuit 202 may comprise a first inductor 210, a second inductor 212, a first capacitor 214, and a second capacitor 216. A first terminal of the inductor 210 may be connected to a first terminal of the differential input/output port. A first terminal of the inductor 212 may be connected to a second terminal of the differential input/output port. A second terminal of the inductor 210 and a second terminal of the inductor 212 may be connected to the circuit ground potential. In an example, the inductors 210 and 212 may be implemented as a center-tapped inductor. A first terminal of the capacitor 214 may be connected to the first terminal of the differential input/output port. A second terminal of the capacitor 214 may be connected to a first terminal of the differential output/input port. A first terminal of the capacitor 216 may be connected to the second terminal of the differential input/output port. A second terminal of the capacitor 216 may be connected to a second terminal of the differential output/input port.

In an example, the circuit 204 may comprise a first inductor 218 and a second inductor 220. A first terminal of the inductor 218 may be connected to a first terminal of the differential input/output port of the circuit 204. A second terminal of the inductor 218 may be connected to a second terminal of the differential input/output port of the circuit 204. A first terminal of the inductor 220 may be connected to a first terminal of the differential output/input port of the circuit 204. A second terminal of the inductor 220 may be connected to a second terminal of the differential output/input port of the circuit 204 and coupled via the capacitor 206 to the circuit ground potential. In an example, the inductors 218 and 220 may be configured as coupled inductor coils. However, the coupled coil of the circuit 204 is not limited to the example shown in FIG. 3. In some embodiments, the circuit 204 may be implemented as a transmission line type coupled coil where the coils 218 and 220 are rotated by 90 degrees.

The circuit 200 generally provides combined benefits of coupled inductor coils with input/output tuning capacitors, a differential high pass filter composed by a differential shunt inductor and alternating current (AC) coupling capacitors at a balanced side of a balun (transformer), and a differential shunt inductor with grounded center tap to achieve a compact wide band balanced balun design for RF wireless communication systems with extended low frequency response. In an example, a 0.35-1.3 GHz differential 100 Ohm to single-ended 50 Ohm on-chip balun (transformer) may be implemented that may achieve less than 0.5 dB amplitude imbalance, have a phase imbalance of less than 5 degrees, and only occupy 0.5 mm×0.5 mm chip area.

In an example, the transformer 204 may be implemented with a planar coupled spiral on the chip. In an example, each of the capacitors 206, 214, and 216 may be implemented as a metal-insulator-metal (MIM) capacitor or a finger capacitor on the chip. In another example, the capacitors 206, 214, and 216 may also be implemented with one or more MOS devices. In general, the capacitors 206, 214, and 216 are implemented using low loss capacitor technologies.

Figure 4:
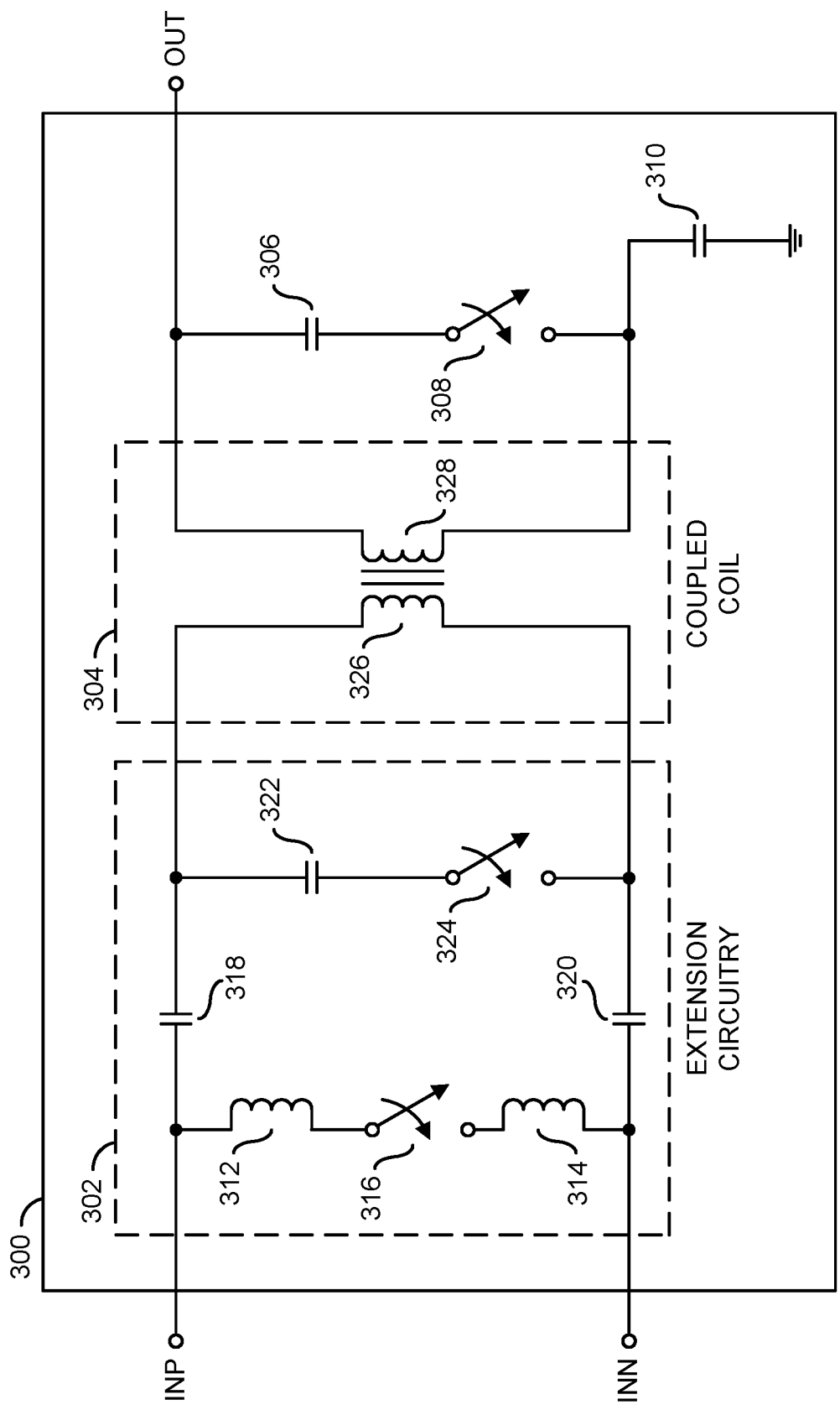
FIG. 4 is a diagram illustrating another example implementation of a balun circuit in accordance with an example embodiment of the invention.

Referring to FIG. 4, a diagram of a circuit 300 is shown illustrating an example implementation of another balun circuit in accordance with an example embodiment of the invention. In various embodiments, the circuit 300 may be used to implement the balun circuits 102 and/or 104 of FIG. 2. In an example, the circuit 300 may comprise a block (or circuit) 302, a block (or circuit) 304, a capacitor 306, a switch 308, and a capacitor 310. In various embodiments, the circuit 302 may implement extension circuitry. In an example, the circuit 304 may be implemented using integrated coupled inductor coils. In an example, the integrated coil structures of the circuit 304 may form spiral inductor devices that are magnetically coupled with one another. In addition to the inductive property of a single coil structure, multiple integrated coil structures may have an associated mutual inductance that may help to achieve a more compact footprint.

In an example, the circuit 300 may have a differential input/output port and a single-ended output/input port. In an example, a differential signal (INP, INN) may be presented to the differential input/output port and a single-ended output signal OUT may be presented at the single-ended output/input port. Operation of the balun circuit 300 may be reversed. For example, a single-ended input signal may be presented to the single-ended output/input port of the circuit 300 and a differential output signal may be presented at the differential input/output port of the circuit 300.

The circuit 302 may have a differential input/output that may be connected to the differential input/output port of the circuit 300. The circuit 302 may have a differential output/input that may be connected to a differential input/output port of the circuit 304. The circuit 304 may have a differential output/input. A first terminal of the differential output/input of the circuit 304 may be connected to a first terminal of the capacitor 306 and the single-ended output/input port of the circuit 300. The switch 308 may be connected between a second terminal of the capacitor 306 and a second terminal of the differential output/input of the circuit 304. The second terminal of the differential output/input of the circuit 304 may be connected via the capacitor 310 to a circuit ground potential.

In an example, the circuit 302 may comprise a first inductor 312, a second inductor 314, a first switch 316, a first capacitor 318, a second capacitor 320, a third capacitor 322, and a second switch 324. A first terminal of the inductor 312 may be connected to a first terminal of the differential input/output port of the circuit 302. A first terminal of the inductor 314 may be connected to a second terminal of the differential input/output port of the circuit 302. The switch 316 may be connected between a second terminal of the inductor 312 and a second terminal of the inductor 314. A first terminal of the capacitor 318 may be connected to the first terminal of the differential input/output port of the circuit 302. A first terminal of the capacitor 320 may be connected to the second terminal of the differential input/output port of the circuit 302. A second terminal of the capacitor 318 may be connected to a first terminal of the capacitor 322 and a first terminal of the differential output/input port of the circuit 302. A second terminal of the capacitor 320 may be connected to a second terminal of the differential output/input port of the circuit 302. The switch 324 may be connected between the second terminal of the capacitor 320 and a second terminal of the capacitor 322. A first output/input of the circuit 304 may be connected to a first terminal of the capacitor 306 and the single ended output/input of the circuit 300. The switch 308 may be connected between a second terminal of the capacitor 306 and a second terminal of the output/input of the circuit 304. The second terminal of the output/input of the circuit 304 may be connected via the capacitor 310 to a circuit ground potential.

In an example, the circuit 304 may comprise a first inductor 326 and a second inductor 328. A first terminal of the inductor 326 may be connected to the first terminal of the differential input/output port of the circuit 304. A second terminal of the inductor 326 may be connected to a second terminal of the differential input/output port of the circuit 304. A first terminal of the inductor 328 may be connected to a first terminal of the differential output/input port of the circuit 304. A second terminal of the inductor 328 may be connected to a second terminal of the differential output/input port of the circuit 304 and coupled via the capacitor 310 to the circuit ground potential. The inductors 326 and 328 may be configured as coupled inductor coils. In an example, the integrated coil structures of the circuit 304 may form spiral inductor devices that are magnetically coupled with one another. In addition to the inductive property of a single coil structure, the multiple integrated coil structures of the circuit 304 may have an associated mutual inductance that may help to achieve a more compact footprint.

The circuit 300 generally provides combined benefits of coupled inductor coils with input/output tuning capacitors, a switch controlled differential inductor at a differential port with switchable input/output tuning capacitors, and an inherent switchable symmetric topology to convert either 100 Ohm or 50 Ohm differential port impedance to a fixed 50 Ohm single-ended impedance and achieve a compact wide band switchable impedance RF transformer balun design for RF wireless communication systems with good phase and amplitude balance for both impedance transformations. In an example, a 1.5-3 GHz switchable 50/100 Ohm differential to 50 Ohm single-ended on-chip balun (transformer) may be implemented that may achieve less than 1 dB amplitude imbalance, have a phase imbalance of less than 5 degrees for both 100 Ohm to 50 Ohm and 50 Ohm to 50 Ohm impedance transformations, and only occupy 0.5 mm×0.5 mm chip area.

In an example, the circuit 304 may be implemented with a planar coupled spiral on the chip. In an example, each of the capacitors 306, 310, 318, 320, and 322 may be implemented as a metal-insulator-metal (MIM) capacitor or a finger capacitor on the chip. In another example, the capacitors 306, 310, 318, 320, and 322 may also be implemented with one or more MOS devices. In general, the capacitors 306, 310, 318, 320, and 322 are implemented using low loss capacitor technologies.

The switches 308, 316, and 324 may be implemented using a variety of switch types including, but not limited to, CMOS, FET, and HEMT technologies. In various embodiment, the switch 316 may be in a conducting state (e.g., ON) when the balun is configured to transform a differential port (e.g., INP/INN side) impedance of 100 Ohms to a single-ended port (e.g., OUT side) impedance of 50 Ohms and in a non-conducting state (e.g., OFF) when the balun is configured to transform a differential port (e.g., INP/INN side) impedance of 50 Ohms to a single-ended port (e.g., OUT side) impedance of 50 Ohms. A state (e.g. conducting or non-conducting) of the switches 308 and 324 may be determined based upon a level of return loss (matching) desired for a particular frequency band.

Figure 5:
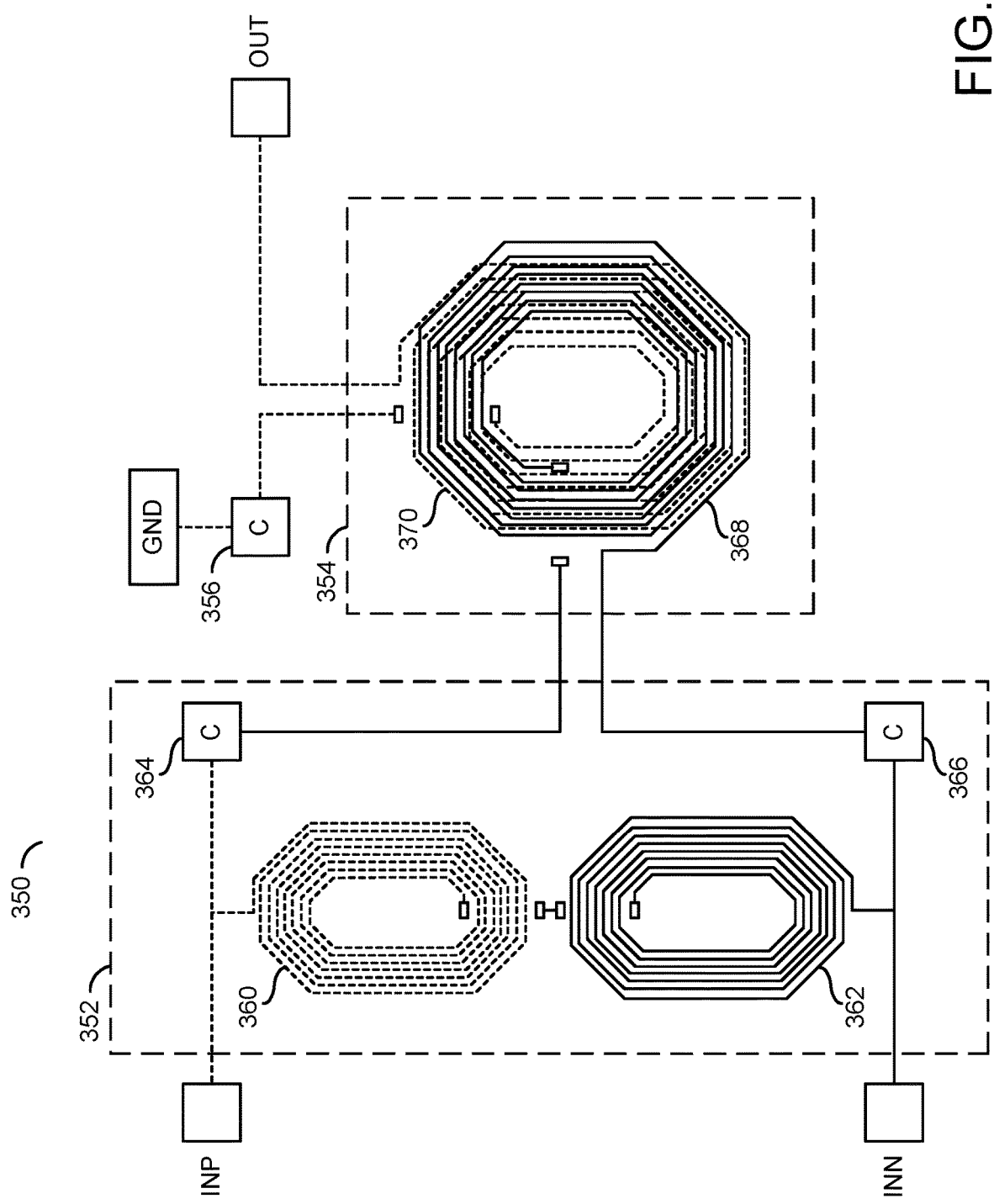
FIG. 5 is a diagram illustrating an example layout of a balun circuit in accordance with an example embodiment of the invention.

Referring to FIG. 5, a diagram is shown illustrating an example layout 350 of a balun circuit in accordance with an example embodiment of the invention. In various embodiments, the layout 350 may be used to implement the circuit 200 and/or the circuit 300. In an example, the circuit 350 may comprise a first circuit portion 352, a second circuit portion 354, and a capacitor 356. In an example, the first circuit portion 352 may comprise a first integrated coil 360, a second integrated coil 362, a first capacitor 364, and a second capacitor 366. The coils 360 and 362 may be laid out next to each other in the same plane on an integrated circuit.

In an example, a first terminal of the coil 360 may be connected to a first input/output pad (e.g., INP) and a first terminal of the capacitor 364. A first terminal of the coil 362 may be connected to a second input/output pad (e.g., INN) and a first terminal of the capacitor 366. A second terminal of the coil 360 may be connected to a second terminal of the coil 362. In various embodiments, the connection between the coils 360 and 362 may be connected to a circuit ground potential (e.g., as illustrated in FIG. 3) or may be connected via a switch (e.g., as illustrated in FIG. 4). A second terminal of the capacitor 364 and a second terminal of the capacitor 366 may be configured as a differential output of the circuit portion 352.

The output of the circuit portion 352 may be connected to an input of the circuit portion 354. The circuit portion 354 may comprise a first integrated coil 368 and a second integrated coil 370. The coils 368 and 370 may be stacked in different planes on an integrated circuit. In an example, a first terminal of the coil 368 may be directly connected to the second terminal of the capacitor 364. A second terminal of the coil 368 may be directly connected to the capacitor 366. A first terminal of the coil 370 may be connected to a first terminal of the capacitor 356. A second terminal of the capacitor 356 may be connected to the circuit ground potential. A second terminal of the coil 370 may be connected to a third input/output pad (e.g., OUT).

Figure 6:
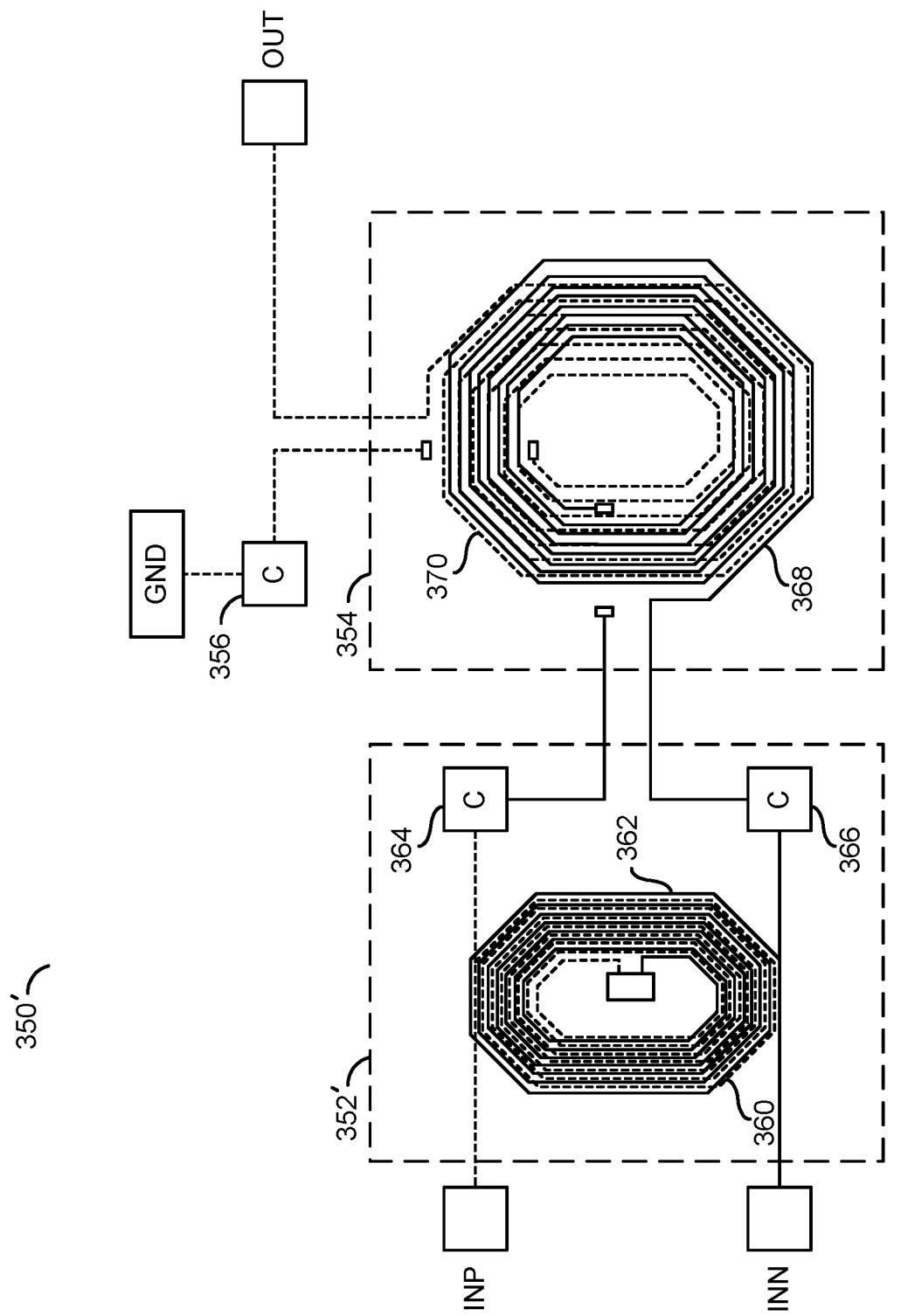
FIG. 6 is a diagram illustrating another example layout of a balun circuit in accordance with an example embodiment of the invention.

Referring to FIG. 6, a diagram is shown illustrating another example layout 350' of a balun circuit in accordance with an example embodiment of the invention. In various embodiments, the layout 350' may be used to implement the circuit 200 and/or the circuit 300. In an example, the circuit 350' may comprise a first circuit portion 352', a second circuit portion 354, and the capacitor 356. In an example, the first circuit portion 352' may comprise the first integrated coil 360, the second integrated coil 362, the first capacitor 364, and the second capacitor 366. The layout of the first portion 352' may be similar to the first portion 350 except that the integrated coils 360 and 362 may be stacked in different planes on the integrated circuit. By stacking the coils 360 and 362, the footprint of the layout 350' may be reduced relative to the footprint of the layout 350.

In an example, the integrated coil structures 360 and 362 of the circuit 350' may comprise spiral inductor devices that are stacked. In addition to the inductive property of a single coil structure, multiple integrated coil structures may have an associated mutual inductance that may help to achieve a more compact footprint for the circuit 352'. The coils 360 and 362 in the layout 350' may be connected similarly to the layout 350.

Figure 7:
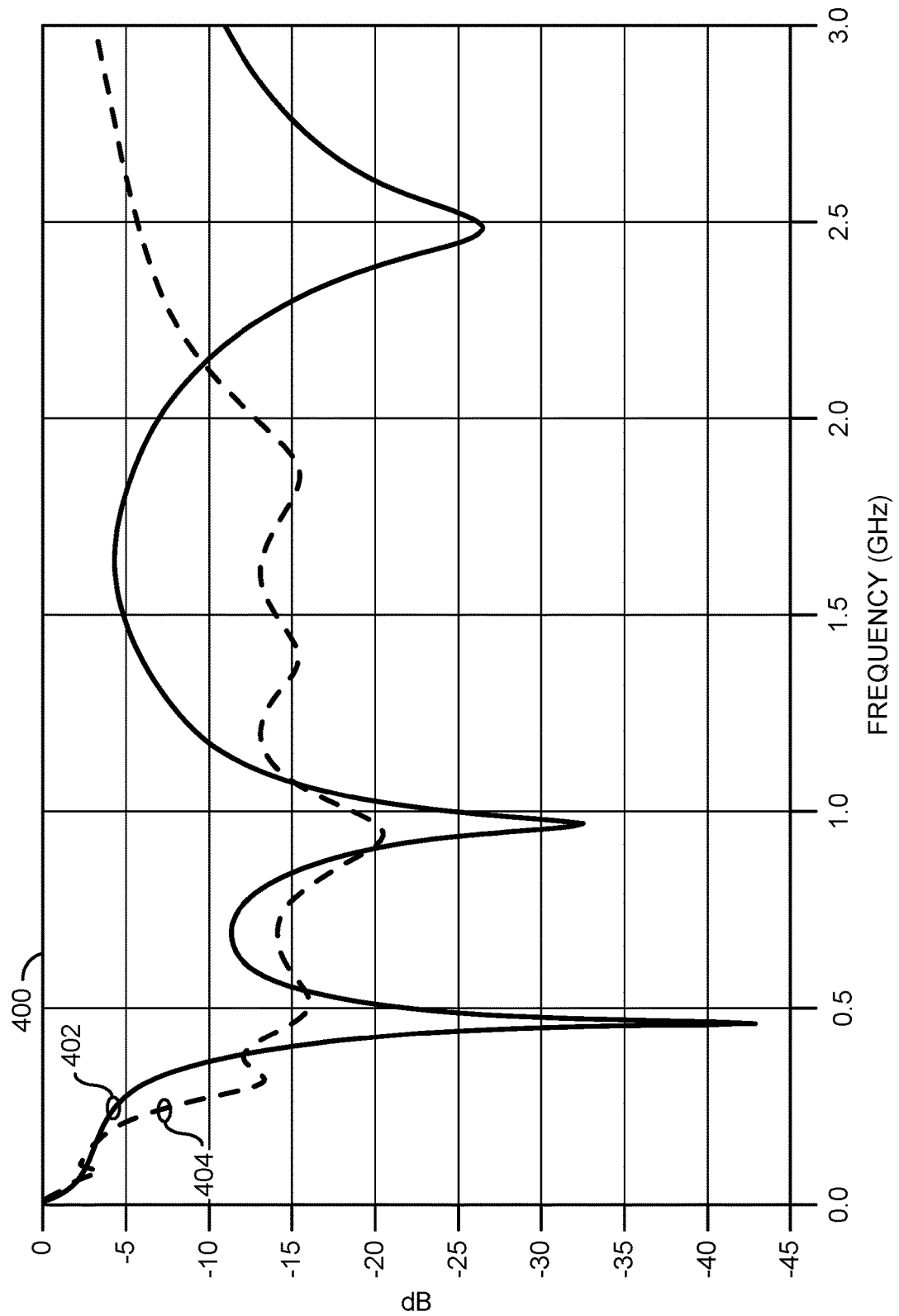
FIG. 7 is a diagram illustrating input matching (S11) and output matching (S22) parameter measurements at typical operating conditions for a fixed input/output impedance application of the balun circuit of FIG. 3.

Referring to FIG. 7, a diagram of a graph 400 is shown illustrating input and output match of the balun circuit 200 of FIG. 3 at typical operating conditions. A curve 402 illustrates input matching (S11) parameter measurements. A curve 404 illustrates output matching (S22) parameter measurements. In an example, a balun design in accordance with an embodiment of the invention may provide an input matching (S11) below −10 dB from 360 to 1200 MHz. In comparison, for a previous balun design without the band extension circuitry, an input matching (S11) of less than or equal to −10 dB may only be achieved from 600 to 950 MHz.

Figure 8:
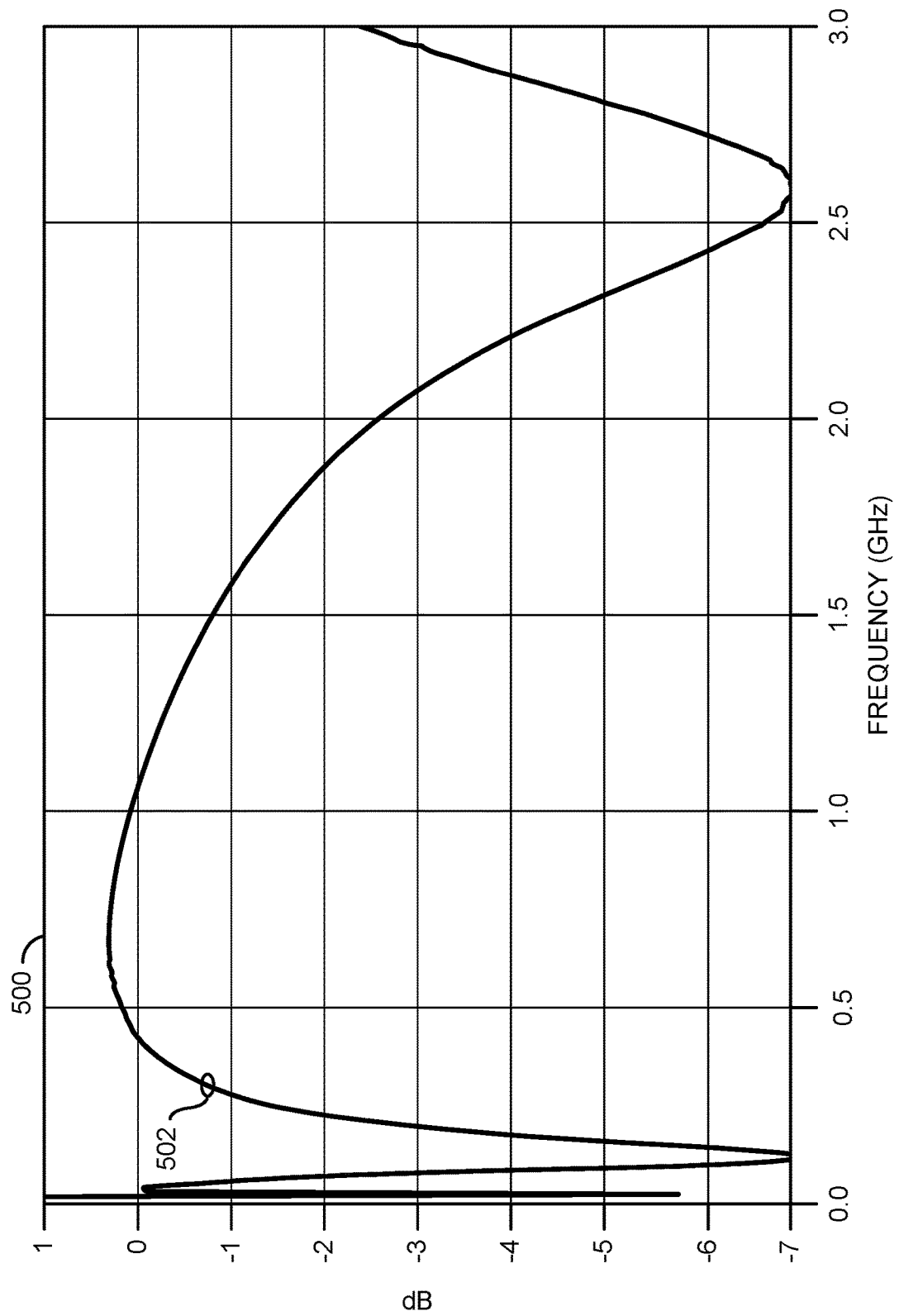
FIG. 8 is a diagram illustrating amplitude imbalance measurement at typical operating conditions of the balun circuit of FIG. 3.

Referring to FIG. 8, a diagram of a graph 500 is shown illustrating amplitude imbalance measurement at typical operating conditions of the balun circuit 200 of FIG. 3. A curve 502 illustrates amplitude imbalance measurements over a range of 3 GHz. Amplitude imbalance measures the mismatch of the output power magnitude between the two balanced (differential) ports. The smaller the value of amplitude imbalance, the better the balun (transformer) performance. In an example, a balun circuit in accordance with an embodiment of the invention may provide a broadband performance with less than +/−1 dB amplitude imbalance from 400 to 1600 MHz.

Figure 9:
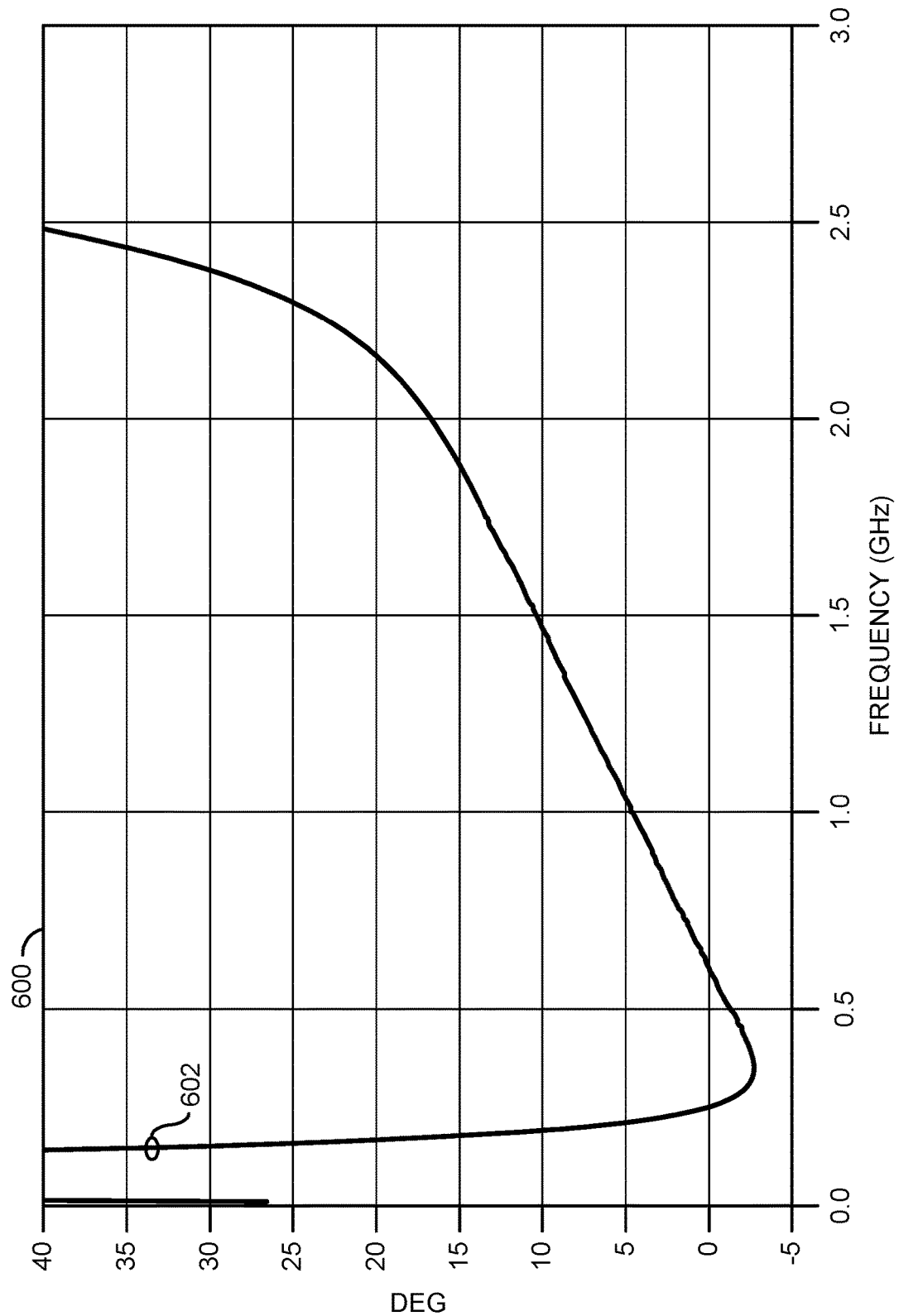
FIG. 9 is a diagram illustrating phase imbalance measurement at typical operating conditions of the balun circuit of FIG. 3.

Referring to FIG. 9, a diagram of a graph 600 is shown illustrating phase imbalance measurement at typical operating conditions of the balun circuit 200 of FIG. 3. A curve 602 illustrates phase imbalance measurements over a range of 3 GHz. Phase imbalance measures the deviation of phase difference between two balanced (differential) ports from 180 degree. The smaller the phase imbalance, the better the balun (transformer) performance. In an example, a balun circuit in accordance with an embodiment of the invention may provide a broadband performance with less than +/−5 degree phase imbalance from 210 to 1040 MHz.

Figure 10:
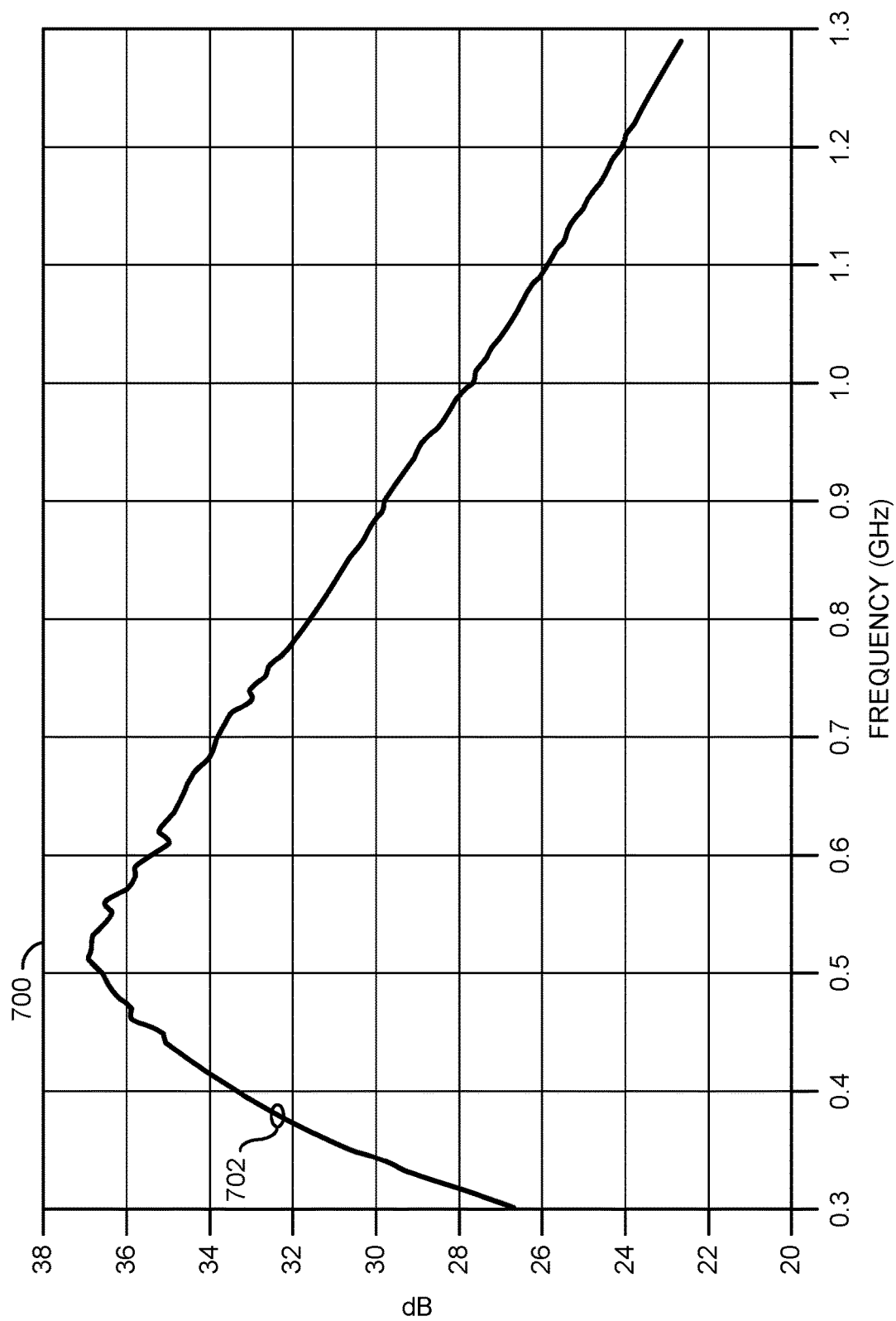
FIG. 10 is a diagram illustrating common mode rejection ratio (CMR) measurement at typical operating conditions of the balun circuit of FIG. 3.

Referring to FIG. 10, a diagram of a graph 700 is shown illustrating common mode rejection ratio (CMR) measurement at typical operating conditions of the balun circuit 200 of FIG. 3. A curve 702 illustrates CMR measurements over a range of 0.3 to 1.3 GHz. CMR is defined as the ratio of wanted to unwanted transmitted power. Rejection of common-mode transmission is a primary purpose of a balun (transformer). A decent balun (transformer) usually has a CMR greater than or equal to 25 dB. In an example, a balun circuit in accordance with an embodiment of the invention may provide a broadband performance with greater than or equal to 25 dB CMR from 300 to 1150 MHz.

Figure 11:
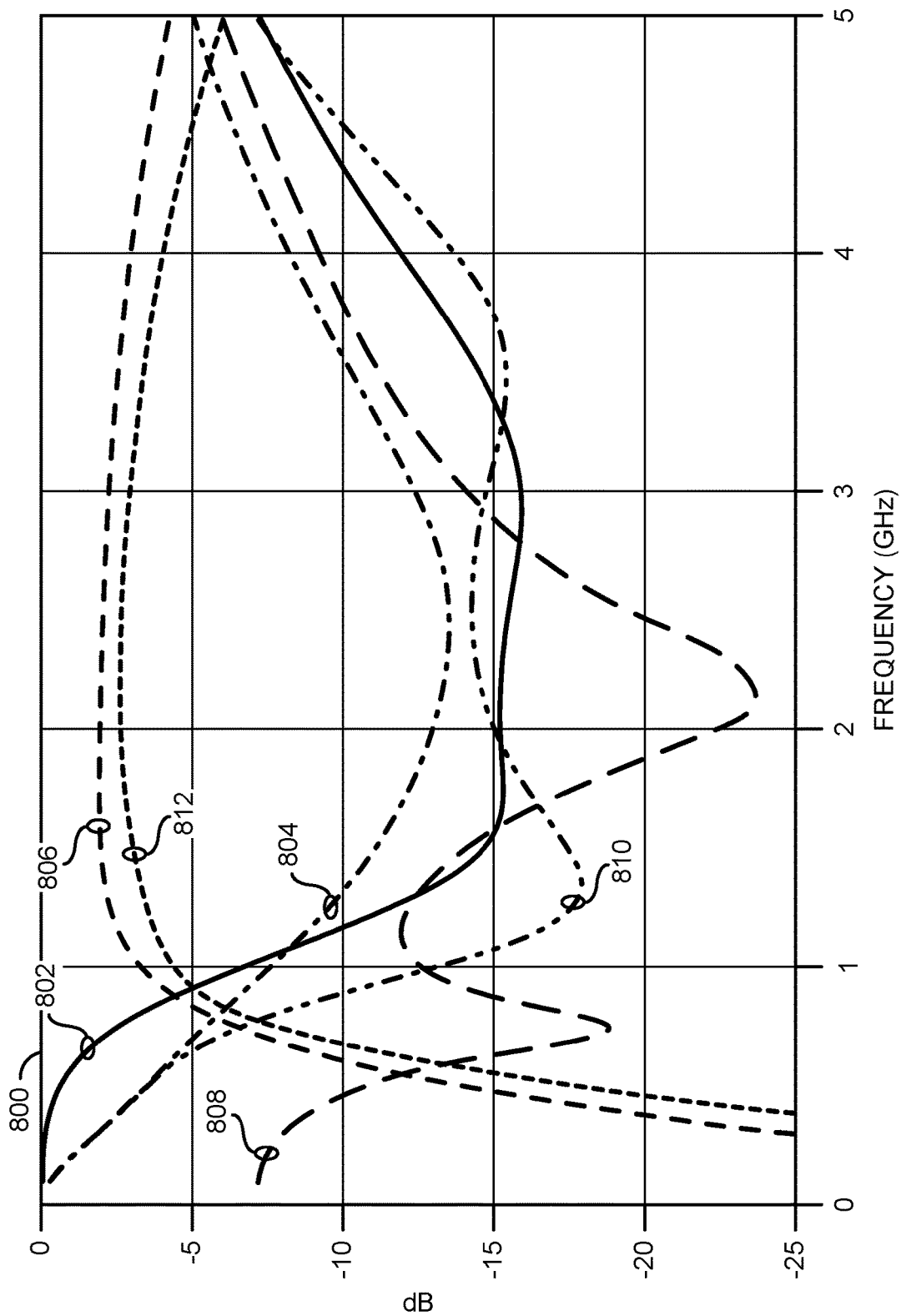
FIG. 11 is a diagram illustrating simulated small signal performance of the switchable balun circuit of FIG. 4.

Referring to FIG. 11, a diagram of a graph 800 is shown illustrating simulated small signal performance of the switchable balun circuit 300 of FIG. 4. A curve 802 illustrates input matching (S11) for a 50 Ohm input over a range of 5 GHz. A curve 804 illustrates output matching (S22) for a 50 Ohm input over a range of 5 GHz. A curve 806 illustrates insertion loss (S21) for a 50 Ohm input over a range of 5 GHz. A curve 808 illustrates input matching (S11) measurements for a 100 Ohm input over a range of 5 GHz. A curve 810 illustrates output matching (S22) for a 100 Ohm input over a range of 5 GHz. A curve 812 illustrates insertion loss (S21) for a 100 Ohm input over a range of 5 GHz. The switchable impedance balun (transformer) illustrated in FIG. 4 may provide a wideband differential port matching (S11) of less than or equal to −10 dB from 1200 to 4000 MHz for both impedance states. A range where the single-ended port matching (S22) is less than or equal to −10 dB is also broad band from 1300 to 3600 MHz for both impedance states.

Figure 12:
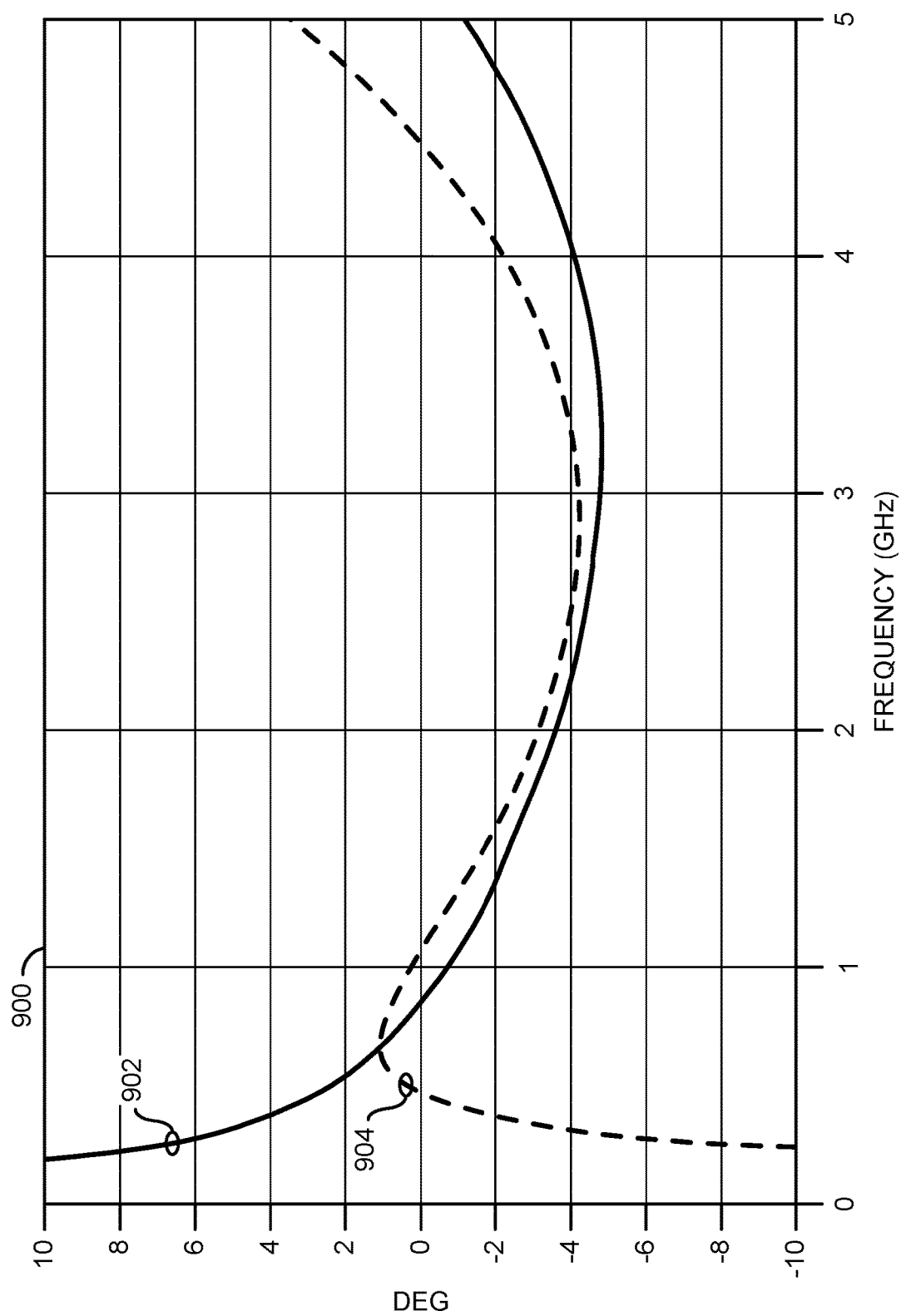
FIG. 12 is a diagram illustrating phase imbalance simulation of the switchable balun circuit of FIG. 4 at typical operating conditions.

Referring to FIG. 12, a diagram of a graph 900 is shown illustrating phase imbalance simulation of the switchable balun circuit 300 of FIG. 4 at typical operating conditions. A curve 902 illustrates phase imbalance for a 50 Ohm input over a range of 5 GHz. A curve 904 illustrates phase imbalance for a 100 Ohm input over a range of 5 GHz. A phase imbalance of less than or equal to +/−5 degree may be achieved in a wide frequency range of 300 to 3500 MHz for both impedance states.

Figure 13:
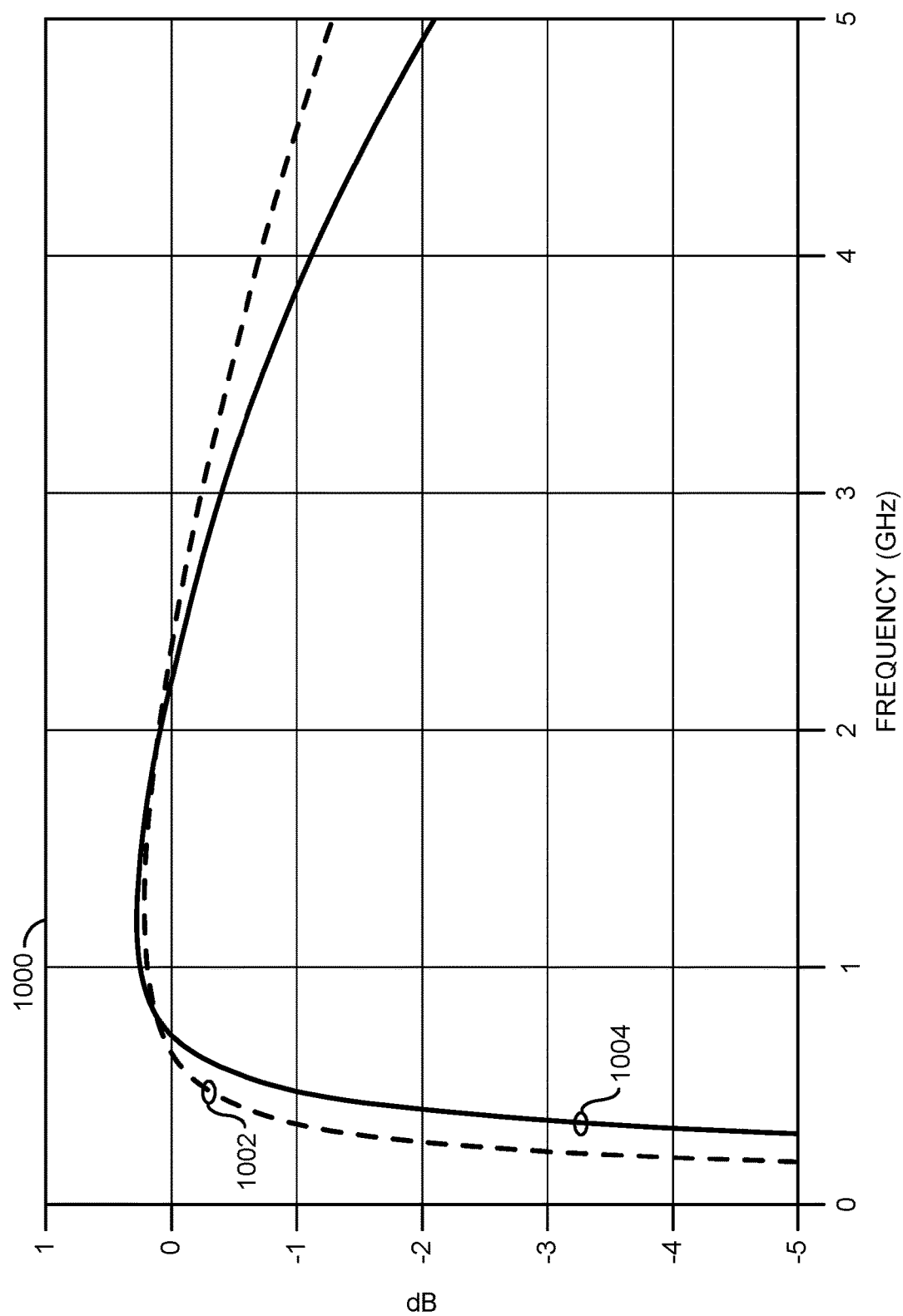
FIG. 13 is a diagram illustrating amplitude imbalance simulation of the switchable balun circuit of FIG. 4 at typical operating conditions.

Referring to FIG. 13, a diagram of a graph 1000 is shown illustrating amplitude imbalance simulation of the switchable balun circuit 300 of FIG. 4 at typical operating conditions. A curve 1002 illustrates amplitude imbalance for a 50 Ohm input over a range of 5 GHz. A curve 1004 illustrates amplitude imbalance for a 100 Ohm input over a range of 5 GHz. An amplitude imbalance of less than or equal to +/−1 dB may be achieved in a wide frequency range of 480 to 4000 MHz for both impedance states.

For conventional balun designs, the bandwidth is limited. To cover a wide frequency range, especially to cover very low frequency down to 400 MHz on chip, a coupled coil needs to be very large. The large size has greater parasitics, which prevents usage at the high end of the band. In a balun in accordance with an embodiment of the invention, the coupled coil may be sized relatively small to achieve good phase/amplitude balance at the high end of the band, while at the low end of the band match and phase/amplitude balance is provided by the symmetric band extension circuitry in the circuit 202 of FIG. 3.

Previous efforts related to switched impedance transformers used switched coils to accommodate the impedance change, which inherently had several coils on chip occupying a large chip area. In a balun in accordance with an embodiment of the invention, the main coupled coil is unchanged when impedance is switched at the differential port, and the matching and phase/amplitude balance is obtained by switching in/out tuning capacitors and the shunt inductor at the differential port.

Although embodiments of the invention have been described in the context of a RF application, the present invention is not limited to RF applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, 5G) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a first circuit comprising differential symmetric band extension circuitry coupling a first differential input/output port to a differential output/input port, said differential symmetric band extension circuitry comprising a first inductor and a second inductor coupled in series between a first terminal of said first differential input/output port and a second terminal of said first differential input/output port; and
a second circuit coupled to said differential output/input port of said first circuit by a second differential input/output port, said second circuit comprising a third inductor coupled to said second differential input/output port and a fourth inductor coupled to a single-ended output/input port, wherein said third inductor and said fourth inductor are configured as coupled inductor coils configured to convert between differential and single-ended signal formats.

2. The apparatus according to claim 1, wherein:
said first circuit further comprises a first capacitor and a second capacitor;
a first terminal of said first differential input/output port is connected to a first terminal of said first inductor and a first terminal of said first capacitor;
a second terminal of said first differential input/output port is connected to a first terminal of said second inductor and a first terminal of said second capacitor;
a second terminal of said first inductor and a second terminal of said second inductor are connected to at least one of a circuit ground potential or a first switch circuit;
a second terminal of said first capacitor is connected to a first terminal of said differential output/input port; and
a second terminal of said second capacitor is connected to a second terminal of said differential output/input port.

3. The apparatus according to claim 2, wherein:
said second circuit further comprises a third capacitor;
a first terminal of said third inductor is connected to a first terminal of said second differential input/output port;
a second terminal of said third inductor is connected to a second terminal of said second differential input/output port;
a first terminal of said fourth inductor is connected to said single-ended output/input port; and
a second terminal of said fourth inductor is connected to the circuit ground potential via said third capacitor.

4. The apparatus according to claim 3, further comprising:
a fourth capacitor having a first terminal connected to said second terminal of said first capacitor;
a second switch circuit connected between a second terminal of said fourth capacitor and said second terminal of said second capacitor;
a fifth capacitor having a first terminal connected to said single-ended output/input port; and
a third switch circuit connected between a second terminal of said fifth capacitor and said second terminal of said fourth inductor.

5. The apparatus according to claim 1, wherein said first and said second circuits are configured as a compact switchable impedance radio frequency (RF) balun.

6. The apparatus according to claim 1, wherein said first and said second circuits are configured to transform at least one of a 50 Ohm impedance differential signal or a 100 Ohm impedance differential signal to a 50 Ohm impedance single-ended signal.

7. The apparatus according to claim 1, wherein said first and said second inductors are either co-planar or stacked.

8. The apparatus according to claim 1, wherein said first and said second circuits are configured as a compact balanced radio frequency (RF) balun.

9. The apparatus according to claim 1, further comprising:
a transceiver circuit coupled to said first circuit; and
a front-end circuit coupled to said second circuit.

10. The apparatus according to claim 9, wherein said second circuit is coupled to an input of a transmitter chain of said front-end circuit and converts a differential signal from said transceiver circuit to a single-ended signal for presentation to an input amplifier of said transmitter chain.

11. The apparatus according to claim 9, wherein said second circuit is coupled to an output of a receiver chain of said front-end circuit and converts a single-ended signal from an output amplifier of said receiver chain to a differential signal for presentation to said transceiver circuit.

12. A method of converting between differential and single-ended signals using a balun comprising the steps of:
coupling a first inductor of said balun between a first terminal of a first differential input/output port and a second terminal of said first differential input/output port;
coupling a first terminal of a second inductor of said balun to a single-ended output/input port and coupling a second terminal of said second inductor of said balun to a circuit ground potential using a first capacitor, wherein said first inductor and said second inductor are configured as coupled inductor coils configured to convert between differential and single-ended signal formats;
sizing said coupled inductor coils of said balun to achieve a predetermined phase/amplitude balance at a high end of a predefined frequency band;
configuring a differential shunt inductor by coupling a third inductor and a fourth inductor in series between a first terminal and a second terminal of a second differential input/output port; and
coupling said first terminal of said second differential input/output port to a first terminal of said first differential input/output port using a second capacitor and coupling said second terminal of said second differential input/output port to a second terminal of said first differential input/output port using a third capacitor, wherein said differential shunt inductor, said second capacitor, and said third capacitor are configured to extend a low frequency response of said balun.

13. The method according to claim 12, wherein:
said third inductor and a second said fourth inductor are connected to at least one of a circuit ground potential or a first switch circuit.

14. The method according to claim 13, further comprising:
setting a state of said first switch circuit based on an impedance of a differential input signal to said balun.

15. The method according to claim 14, wherein said first switch circuit is set to a conducting state to transform a 100 Ohm impedance differential signal to a 50 Ohm impedance single-ended signal.

16. The method according to claim 14, wherein said first switch circuit is set to a non-conducting state to transform a 50 Ohm impedance differential signal to a 50 Ohm impedance single-ended signal.

17. The method according to claim 13, wherein said third inductor and said fourth inductor are either co-planar or stacked.

18. The method according to claim 12, further comprising:
configuring a first switched capacitor at a differential side of said coupled inductor coils and a second switched capacitor at a single-ended side of said coupled inductor coils based on a return loss level for a particular frequency range.

19. An apparatus comprising:
a first circuit comprising (i) a differential input/output port, (ii) a differential output/input port, a first inductor, a second inductor, a first capacitor, and a second capacitor, wherein a first terminal of said differential input/output port is connected to a first terminal of said first inductor and a first terminal of said first capacitor, a second terminal of said differential input/output port is connected to a first terminal of said second inductor and a first terminal of said second capacitor, a second terminal of said first inductor and a second terminal of said second inductor are connected to at least one of a circuit ground potential or a first switch circuit, a second terminal of said first capacitor is connected to a first terminal of said differential output/input port, and a second terminal of said second capacitor is connected to a second terminal of said differential output/input port; and
a second circuit comprising a second differential input/output port, a single-ended output/input port, a third inductor, and a fourth inductor, wherein a first terminal of said third inductor is connected to a first terminal of said second differential input/output port, a second terminal of said third inductor is connected to a second terminal of said second differential input/output port, a first terminal of said fourth inductor is connected to said single-ended output/input port, a second terminal of said fourth inductor is connected to the circuit ground potential via a third capacitor, and said third inductor and said fourth inductor are configured as coupled inductor coils configured to convert between differential and single-ended signal formats.

20. The apparatus according to claim 19, further comprising:
a fourth capacitor having a first terminal connected to said second terminal of said first capacitor;
a second switch circuit connected between a second terminal of said fourth capacitor and said second terminal of said second capacitor;
a fifth capacitor having a first terminal connected to said single-ended output/input port; and
a third switch circuit connected between a second terminal of said fifth capacitor and said second terminal of said fourth inductor.

* * * * *